US009203388B2

(12) United States Patent
Lee

(10) Patent No.: US 9,203,388 B2
(45) Date of Patent: Dec. 1, 2015

(54) METHOD FOR GENERATING CLOCK FOR SYSTEM OPERATING AT RISING EDGE

(71) Applicant: LSIS CO., LTD., Anyang-si, Gyeonggi-do (KR)

(72) Inventor: Ji Geon Lee, Seoul (KR)

(73) Assignee: LSIS Co., Ltd., Anyang-Si, Gyeonggi-Do (KR)

( * ) Notice: Subject to any disclaimer, the term of this patent is extended or adjusted under 35 U.S.C. 154(b) by 0 days.

(21) Appl. No.: 14/524,508

(22) Filed: Oct. 27, 2014

(65) Prior Publication Data
US 2015/0214941 A1    Jul. 30, 2015

(30) Foreign Application Priority Data
Jan. 27, 2014 (KR) .................. 10-2014-0009486

(51) Int. Cl.
*H03K 5/135* (2006.01)
*H03K 5/1534* (2006.01)
*G06F 1/08* (2006.01)
*H03K 23/68* (2006.01)

(52) U.S. Cl.
CPC ............... *H03K 5/1534* (2013.01); *G06F 1/08* (2013.01); *H03K 23/68* (2013.01)

(58) Field of Classification Search
USPC .............. 327/39, 42, 44, 72–73, 77–78, 327/113–115, 117, 170–172, 175, 291–294, 327/299
See application file for complete search history.

(56) References Cited

U.S. PATENT DOCUMENTS

| 4,078,203 A | 3/1978 | Borst |
| 7,205,800 B2 | 4/2007 | Hasegawa |
| 7,545,898 B2 * | 6/2009 | Hatti ............... H04L 7/0331 375/293 |

FOREIGN PATENT DOCUMENTS

EP    0445979    9/1991

OTHER PUBLICATIONS

European Patent Office Application Serial No. 14193374.7, Search Report dated Sep. 17, 2015, 7 pages.

* cited by examiner

*Primary Examiner* — An Luu
(74) *Attorney, Agent, or Firm* — Lee, Hong, Degerman, Kang & Waimey

(57) ABSTRACT

A method of converting an input clock to generate an output clock and providing a certain system with the output clock is provided. The method includes setting up a desired output clock value and a variable value and determining whether the input clock is the rising edge; adding the output clock value to the variable value to provide a calculated value when the input clock is the rising edge; comparing the calculated value with the input clock value; and outputting, when the calculated value is equal to or larger than the input clock value as a result of comparison, the output clock as logic state '1' and setting, a value obtained by subtracting the input clock value from the calculated value, as the variable value.

7 Claims, 3 Drawing Sheets

METHOD FOR GENERATING CLOCK FOR SYSTEM OPERATING AT RISING EDGE

CROSS-REFERENCE TO RELATED APPLICATIONS

Pursuant to 35 U.S.C. §119(a), this application claims the benefit of earlier filing date and right of priority to Korean Patent Application No. 10-2014-0009486, filed on Jan. 27, 2014, the contents of which are hereby incorporated by reference herein in its entirety.

BACKGROUND

The present disclosure relates to a method of generating a clock operating at a rising edge and more particularly, to a method of generating a clock signal in a simple structure at high precision.

The clock signal is a square wave signal in which logic states '1' and '0' are regularly represented. In a general system, a clock has a certain duty ratio and the system is synchronized with the clock to process various signals.

A clock generation device may be a device that generates a clock having a certain duty ratio to be used in a system and may include a PLL circuit. However, the PLL circuit has limitations in that its logic is complex and it needs many transistors.

FIG. 1 shows how to provide a system needing a clock having a certain duty ratio with a clock.

Referring to FIG. 1, a PLL circuit 11 adjusts an input clock and generates an output clock suitable for a system 12. In this case, the PLL circuit may be implemented in both hardware and software, and since a hardware PLL structure has high precision but is complex in logic structure, it needs many transistors. On the contrary, a software-type PLL structure has a limitation in that it is difficult to ensure the precision of an output clock.

Also, in order to provide a system with a clock having a certain duty ratio, a clock adjustment by the PLL circuit is needed but a system that operates only at the rising edge or falling edge of the clock does not need a PLL circuit having a complex structure. Thus, in a system that needs a clock without a certain duty ratio, generating the clock precisely is needed.

SUMMARY

Embodiments provide a method of generating a clock at high precision through a simple structure, in the case of a system that operates in the rising edge of the clock.

In one embodiment, a method of converting an input clock to generate an output clock and providing a certain system with the output clock includes setting up a desired output clock value and a variable value and determining whether the input clock is the rising edge; adding the output clock value to the variable value to provide a calculated value when the input clock is the rising edge; comparing the calculated value with the input clock value; and outputting, when the calculated value is equal to or larger than the input clock value as a result of comparison, the output clock as logic state '1' and setting, a value obtained by subtracting the input clock value from the calculated value, as the variable value.

The output clock value may be set to be smaller than the frequency of the input clock.

The determining of whether the input clock is the rising edge may include continually checking whether the input clock is the rising edge, when the input clock is not the rising edge.

When the calculated value is smaller than the input clock value as a result of comparison, the variable value may be set with the calculated value and then it may be checked whether the input clock is the rising edge.

When the calculated is equal to or larger than the input clock value, the output clock may be output with logic state '1' and then with logic state '0' at the rising edge of the input clock.

The variable value may be initially set to 0, and in this case, the output clock may be set as logic state '0'.

The method may further include determining whether the input clock is the rising edge, after the setting of the value obtained by subtracting the input clock value from the calculated value as the variable value.

The details of one or more embodiments are set forth in the accompanying drawings and the description below. Other features will be apparent from the description and drawings, and from the claims.

DETAILED DESCRIPTION OF THE EMBODIMENTS

Reference will now be made in detail to embodiments of the present disclosure, examples of which are illustrated in the accompanying drawings.

Figure 1:
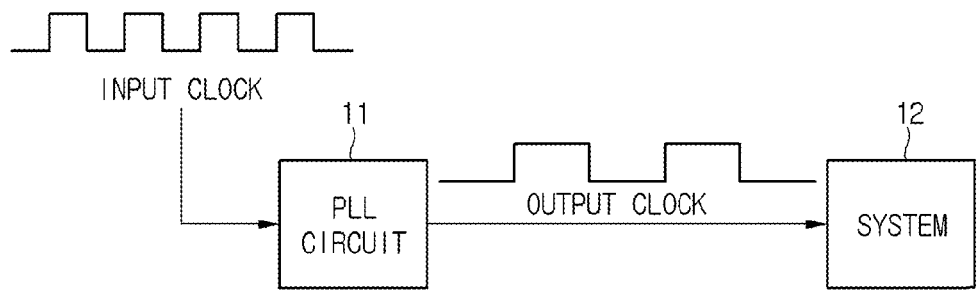
FIG. 1 shows how to provide, a system needing a clock having a certain duty ratio, with a clock.
Figure 2:
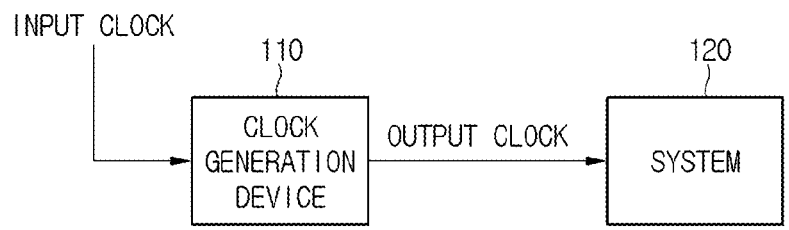
FIG. 2 shows an example of where a clock generation device according to an embodiment is used.
Figure 3:
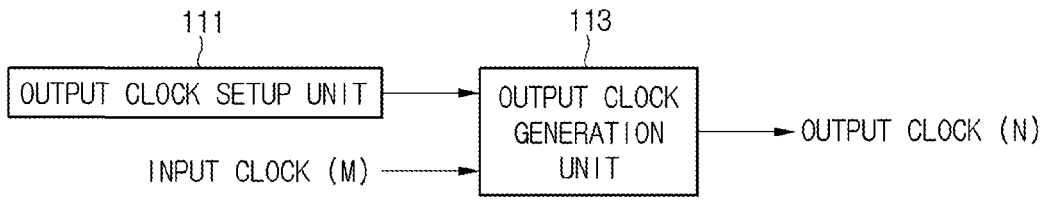
FIG. 3 shows a configuration of a clock generation device for a system operating at a rising edge according to an embodiment.

FIG. 2 shows an example of where a clock generation device according to an embodiment is used, and FIG. 3 shows a configuration of a clock generation device for a system operating at a rising edge according to an embodiment.

Referring to FIGS. 2 and 3, a clock generation device according to an embodiment is applied to a system that operates by a rising edge. In addition, a clock generation device 110 changes an input clock to be suitable for a system 120 and provides the system 120 with a generated output clock.

In addition, the clock generation device 110 may include an output clock setup unit 11 and an output clock generation unit 113.

The output clock setup unit 111 is used for setting up an output clock to be provided for the system 120 and may be a user interface with which a user set up an output clock. For example, it may include an input screen that is shown on a display to be able to input an output clock, and an input unit such as a keyboard.

That is, a user may input a desired output clock to the input screen shown on the display by using a keyboard to set up the output clock.

In this case, since the output clock is generated by using the rising edge of an input clock in the present embodiment, the output clock may be set to be smaller than the input clock. In addition, the unit of a value set up for the output clock setup unit 111 is a frequency.

The output clock generation unit 113 changes the frequency of the input clock based on a setup value set by the output clock setup unit 111 and generates the output clock. The operation of the output clock generation unit 113 is described with reference to FIGS. 4 and 5.

Figure 4:
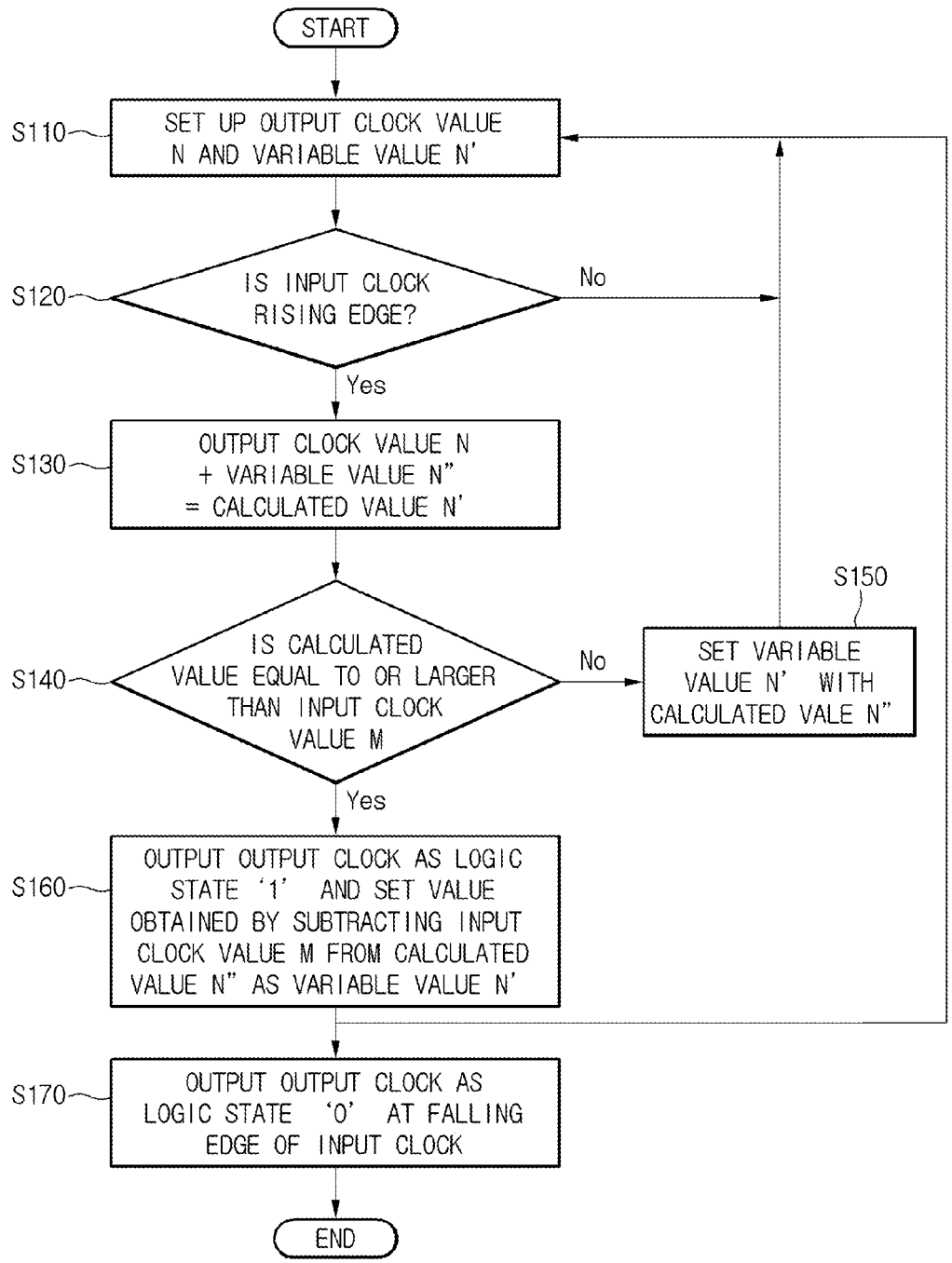
FIG. 4 is a flowchart of the operation of a clock generation device for a system operating at a rising edge according to an embodiment.

FIG. 4 is a flowchart of the operation of a clock generation device for a system operating at a rising edge according to an embodiment.

Referring to FIG. 4, a desired output clock value N and a variable value N' are firstly set up in step S110. In this case, the output clock value N is set up to be smaller than an input clock value M. In addition, the output clock value is set up through the output clock setup unit 111 and the variable value N' is initially set to '0'.

Next, the output clock generation unit 113 receives the output clock value set up by the output clock setup unit 111 and an input clock, converts the frequency of the input clock based on the output clock value, then generates and outputs the output clock.

In particular, it is determined whether the input clock is a rising edge in step S120, and when negative, it is continually checked whether the input clock is the rising edge. In this case, the output clock is initially set with logic state '0'.

When it is determined that the input clock is the rising edge, the output clock generation unit 113 adds the variable value N' to the output clock value N to generate a calculated value N" in step S130.

Next, the input clock value M is compared with the calculated value N" in step S140, and when the latter is smaller than the former (No in step S140), the variable value N' is set with the calculated value N" in step S150. In addition, it is again determined whether the input clock is the rising edge in step S120.

When the calculated value N" is equal to or larger than the input clock value M (Yes in step S140), the output clock generation unit 113 generates the output clock of logic state '1' for a certain time and sets, a value obtained by subtracting the input clock value M from the calculated value N", as the variable value N' in step S160.

Next, it is determined whether the input clock is the rising edge in step S120, and by repetitively performing such an operation, an output clock converted into a frequency set as an output setup value A time period during which the logic state '1' of the output clock is maintained is the same as the width of logic state '1' of the input clock. That is, the output state of the output clock maintains logic state '1' and then changes to logic state '0' as at the falling edge of the input clock.

Thus, the output clock generation unit 113 maintains the output clock at logic state '1' and outputs the output clock with logic state '0' at the falling edge of the input clock, in step S170.

Figure 5:
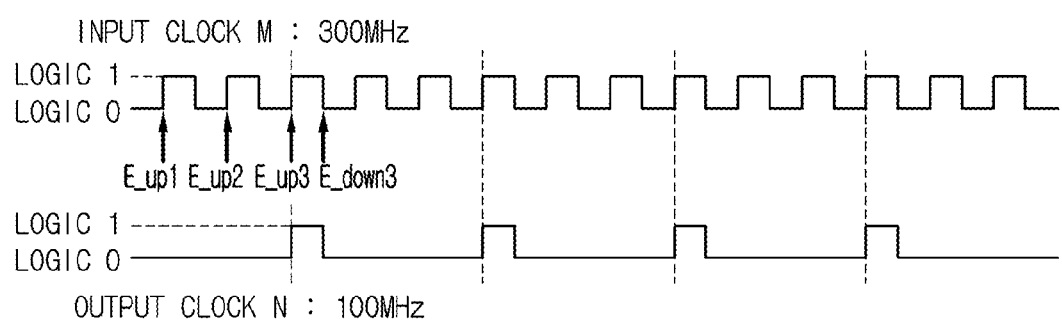
FIG. 5 is an exemplary waveform diagram of an output clock that is generated by a method of generating a clock for a system operating at a rising edge according to an embodiment.

FIG. 5 is an exemplary waveform diagram of an output clock that is generated by a method of generating a clock for a system operating at a rising edge according to an embodiment.

FIG. 5 shows that the input clock value M is 300 MHz and the output clock value N is 100 MHz. When the first rising edge E_up1 of the input clock is input (Yes in step S120) while the output clock value N is initially set to 100 and the variable value N' is initially set to 0 in step S110, the output clock value N '100' is added to the variable value N"'0' to provide a calculated value N" '100' in step S130.

Next, the input clock value M '300' is compared with the calculated value N" '100' in step S140, and since the latter M is smaller than the former N" (No in step S140), the variable value N' is set with the calculated value N" in step S150. Thus, the variable value N' becomes 100 and then it is determined whether the input clock is the rising edge in step S120.

Next, when the second rising edge E_up2 of the input clock is input, an output clock value N '100' is added to the variable value N"'100' to provide a calculated value N" '200' in step S130.

Next, the input clock value M '300' is compared with the calculated value N" '200' in step S140, and since the former M is larger than the latter N" (No in step S140), the variable value N' is set with the calculated value N" in step S150, the variable value N' becomes 200 and then it is determined whether the input clock is the rising edge in step S120.

Next, when the third rising edge E_up3 of the input clock is input, the output clock value N '100' is added to the variable value N"'200' to provide a calculated value N" '300' in step S130. In addition, the input clock value M '300' is compared with the calculated value N" '300' in step S140, and since the former M is equal to the latter N" (Yes in step S140), the output clock is output as logic state '1' and zero obtained by subtracting the input clock value M '300' from the calculated value N" '300' is set as the variable value N' in step S160.

Next, it is again determined whether the input clock is a rising edge in step S120, and as such a process is repeated, an output clock is generated.

The output clock maintains logic state '1' and then logic state '0' at the falling edge of the input clock in step S170.

Accordingly, when being applied to the generation of a clock for a system operating at a rising edge using only the rising edge of the clock without needing a certain duty ratio, it is possible to generate the clock without using a complex PLL. In addition, it is possible to ensure the precision of an output clock that a software-type PLL structure may not ensure.

What is claimed is:

1. A method of generating a clock for a system operating at a rising edge, converting an input clock to generate an output clock and providing a certain system with the output clock, the method comprising:

setting up a desired output clock value and a variable value and determining whether the input clock is the rising edge;

adding the output clock value to the variable value to provide a calculated value when the input clock is the rising edge;

comparing the calculated value with the input clock value; and outputting, when the calculated value is equal to or larger than the input clock value as a result of comparison, the output clock as logic state '1' and setting, a value obtained by subtracting the input clock value from the calculated value, as the variable value.

2. The method according to claim 1, wherein the output clock value is set to be smaller than the frequency of the input clock.

3. The method according to claim 1, wherein the determining of whether the input clock is the rising edge comprises continually checking whether the input clock is the rising edge, when the input clock is not the rising edge.

4. The method according to claim 1, wherein when the calculated value is smaller than the input clock value as a result of comparison, the variable value is set with the calculated value and then it is checked whether the input clock is the rising edge.

5. The method according to claim 1, wherein when the calculated is equal to or larger than the input clock value, the output clock is output with logic state '1' and then with logic state '0' at the rising edge of the input clock.

6. The method according to claim 1, wherein the variable value is initially set to 0, and in this case, the output clock is set as logic state '0'.

7. The method according to claim 1, further comprising determining whether the input clock is the rising edge, after the setting of the value obtained by subtracting the input clock value from the calculated value as the variable value.

* * * * *